(12) United States Patent
Okawa

(10) Patent No.: US 9,923,089 B2
(45) Date of Patent: Mar. 20, 2018

(54) SWITCHING DEVICE

(71) Applicant: TOYOTA JIDOSHA KABUSHIKI KAISHA, Toyota-shi, Aichi-ken (JP)

(72) Inventor: Takashi Okawa, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/285,015

(22) Filed: Oct. 4, 2016

(65) Prior Publication Data

US 2017/0133498 A1 May 11, 2017

(30) Foreign Application Priority Data

Nov. 5, 2015 (JP) ................. 2015-217791

(51) Int. Cl.

| H01L 31/0256 | (2006.01) |
|---|---|
| H01L 29/778 | (2006.01) |
| H01L 29/08 | (2006.01) |
| H01L 29/205 | (2006.01) |
| H01L 29/36 | (2006.01) |
| H01L 29/40 | (2006.01) |
| H01L 29/417 | (2006.01) |
| H01L 29/423 | (2006.01) |

(Continued)

(52) U.S. Cl.
CPC ...... *H01L 29/7787* (2013.01); *H01L 29/0619* (2013.01); *H01L 29/0891* (2013.01); *H01L 29/205* (2013.01); *H01L 29/36* (2013.01); *H01L 29/405* (2013.01); *H01L 29/41758* (2013.01); *H01L 29/42316* (2013.01); *H01L 29/7786* (2013.01); *H01L 29/1066* (2013.01); *H01L 29/2003* (2013.01)

(58) Field of Classification Search
CPC ............. H01L 29/7787; H01L 29/0891; H01L 29/2003; H01L 29/205; H01L 29/36; H01L 29/405; H01L 29/41758; H01L 29/42316
USPC ........................................................ 257/76
See application file for complete search history.

(56) References Cited

U.S. PATENT DOCUMENTS 6,680,515 B1 * 1/2004 Hsing ................. H01L 29/405
257/138
9,147,743 B2 * 9/2015 Yao ...................... H01L 29/402
(Continued)

FOREIGN PATENT DOCUMENTS

| JP | 2006-351753 A | 12/2006 |
| JP | 2007-048866 A | 2/2007 |

(Continued)

*Primary Examiner* — Kevin M Picardat
(74) *Attorney, Agent, or Firm* — Oliff PLC

(57) ABSTRACT

The switching device includes an electron transport layer; an electron supply layer provided on the electron transport layer and being in contact with the electron transport layer by heterojunction; a source electrode being in contact with the electron supply layer; a drain electrode being in contact with the electron supply layer at a position spaced from the source electrode; and a first gate electrode provided above the electron supply layer, and provided between the source electrode and the drain electrode when viewed in a plan view from above. The first gate electrode is electrically connected above the electron supply layer to the drain electrode. An on-resistance of the switching device is lower than an electric resistance between the first gate electrode and the drain electrode.

13 Claims, 9 Drawing Sheets

(51) Int. Cl.
*H01L 29/06* (2006.01)
*H01L 29/20* (2006.01)
*H01L 29/10* (2006.01)

(56) References Cited

U.S. PATENT DOCUMENTS

| | | | | |
|---|---|---|---|---|
| 2006/0102929 A1* | 5/2006 | Okamoto | ............. | H01L 29/402 |
| | | | | 257/189 |
| 2011/0049529 A1* | 3/2011 | Sato | ................ | H01L 21/02164 |
| | | | | 257/76 |
| 2011/0260217 A1 | 10/2011 | Okamoto et al. | | |
| 2012/0175679 A1* | 7/2012 | Marino | ................ | H01L 29/402 |
| | | | | 257/194 |
| 2012/0217505 A1 | 8/2012 | Ando | | |
| 2012/0217507 A1* | 8/2012 | Ohki | ................ | H01L 29/2003 |
| | | | | 257/76 |
| 2014/0306181 A1 | 10/2014 | Shin et al. | | |
| 2015/0048421 A1* | 2/2015 | Park | ................ | H01L 29/66462 |
| | | | | 257/194 |
| 2015/0069469 A1* | 3/2015 | Saito | ................ | H01L 27/0605 |
| | | | | 257/194 |
| 2016/0064600 A1* | 3/2016 | Kuroda | ............. | H01L 29/7786 |
| | | | | 257/13 |
| 2016/0359032 A1* | 12/2016 | Kotani | ............. | H01L 21/02458 |

FOREIGN PATENT DOCUMENTS

| | | |
|---|---|---|
| JP | 2008-034438 A | 2/2008 |
| JP | 2010-109117 A | 5/2010 |
| JP | 2011-119366 A | 6/2011 |
| JP | 2012-178495 A | 9/2012 |
| JP | 2014-212317 A | 11/2014 |
| WO | 2010/082272 A1 | 7/2010 |

* cited by examiner

SWITCHING DEVICE

TECHNICAL FIELD

The technique disclosed herein relates to a switching device.

BACKGROUND ART

Japanese Patent Application Publication No. 2010-109117 discloses a switching device provided with a GaN layer and an AlGaN layer. The GaN layer forms a heterojunction with the AlGaN layer. Due to this, a two-dimensional electron gas (hereafter referred to as "2DEG") is generated at an interface between the GaN layer and the AlGaN layer. A gate electrode is provided on the AlGaN layer. When a gate potential is lowered than a threshold, the 2DEG under the gate electrode vanishes. At this occasion, the 2DEG in the heterojunction separates into a drain electrode side and a source electrode side. Due to this, no current flows between the drain electrode and the source electrode. That is, the switching device turns off. When the gate potential is increased than the threshold, the 2DEG reappears under the gate electrode, and the drain electrode and the source electrode are connected by the 2DEG. Thus, current flows between the drain electrode and the source electrode. That is, the switching device turns on. Accordingly, the switching device can be switched on and off by controlling the gate potential. Notably, the aforementioned threshold may be higher than 0V (that is, 0V means a same potential as a source electrode) or may be lower than 0V. A switching device with the threshold higher than 0V is of a normally-off type, and a switching device with the threshold lower than 0V is of a normally-on type. Further, there also is a switching device in which a two-dimensional hole gas (hereafter referred to as "2DHG") is generated at a heterojunction. The switching device that utilizes the two-dimensional hole gas turns on when its gate potential is lowered than the threshold, and turns off when the gate potential is increased than the threshold In any of the aforementioned switching devices, an electric field is generated in a semiconductor layer between the gate electrode and the drain electrode when the switching device is turned off. At this occasion, in general, the semiconductor layer in a vicinity of an end of the gate electrode on the drain electrode side (for example, the AlGaN layer in the case of Japanese Patent Application Publication No. 2010-109117) is prone to electric field concentration. If a high electric field is generated in the semiconductor layer, a voltage resistance of the switching device is deteriorated. With respect to this, the switching device of Japanese Patent Application Publication No. 2010-109117 includes a field plate extending from the gate electrode toward the drain electrode side above the AlGaN layer. The field plate is arranged on an insulating layer covering a front surface of the AlGaN layer. Since the field plate is connected to the gate electrode, it has a substantially same potential as the gate electrode. When the field plate is arranged as aforementioned, the electric field concentration in the vicinity of the end of the gate electrode on the drain electrode side is mitigated.

SUMMARY

In the switching device of Japanese Patent Application Publication No. 2010-109117, the electric field is concentrated between the field plate and the drain electrode due to a distance between the field plate and the drain electrode being short. Especially, the electric field is prone to being concentrated in a vicinity of an end of the field plate on the drain electrode side. Due to this, a high electric field is generated in the semiconductor layer (for example the AlGaN layer) in the vicinity of this end. The voltage resistance of the switching device cannot be improved sufficiently even with the above structure. Thus, the present disclosure provides a switching device that utilizes a heterojunction (that is, a 2DEG or a 2DHG), in which a local electric field concentration at a part of a region between a gate electrode and a drain electrode can effectively be suppressed.

The switching device disclosed herein comprises an electron transport layer, an electron supply layer, a source electrode, a drain electrode, and a first gate electrode. The electron supply layer is provided on the electron transport layer and in contact with the electron transport layer by heterojunction. The source electrode is in contact with the electron supply layer. The drain electrode is in contact with the electron supply layer at a position spaced from the source electrode. The first gate electrode is provided above the electron supply layer, and provided between the source electrode and the drain electrode when viewed in a plan view from above. The first gate electrode is electrically connected above the electron supply layer to the drain electrode. An on-resistance of the switching device is lower than an electric resistance between the first gate electrode and the drain electrode.

Notably, in this disclosure, "upper" and "lower" refer to a positional relationship inside the switching device, and an electron supply layer side is an "upper" side, and an electron transport layer side is a "lower" side along a lamination direction of the electron transport layer and the electron supply layer. Thus, in a state of actual use of the switching device, the electron supply layer side will be termed the "upper" side and the electron transport layer side will be termed the "lower" side even if the electron supply layer is arranged on a side closer to a ground surface than the electron transport layer. Further, the aforementioned "on-resistance" refers to an electric resistance between the drain electrode and the source electrode when the switching device is on. Further, in this disclosure, "gate electrode" (for example, the first gate electrode) refers to an electrode capable of switching the switching device on and of by its potential. The gate electrode may be directly in contact with the electron supply layer (for example, in a Schottky contact), or may be connected to the electron supply layer via another layer, such as an insulating layer or a p-type layer.

This switching device switches on and off according to the potential of the first gate electrode. When the switching device turns on, current flows between the drain electrode and the source electrode through the heterojunction (that is, a 2DEG or a 2DHG). In a state where the switching device is on, a potential difference between the first gate electrode and the drain electrode is small compared to a state where the switching device is off. Further, an electric resistance between the first gate electrode and the drain electrode is higher than the on-resistance of the switching device. Accordingly, in this state, the current is less likely to flow between the first gate electrode and the drain electrode. When the switching device is turned off, the potential difference between the first gate electrode and the drain electrode becomes large. Due to this, the current flows between the first gate electrode and the drain electrode. In a state where the current is flowing between the first gate electrode and the drain electrode, an electric field is distributed relatively uniformly in a current path thereof. That is, the electric field is distributed relatively uniformly between the first gate electrode and the drain electrode. Due to this, in this switching device, the local electric field concentration at a part of the region between the first gate electrode and the drain electrode during when the device is off can be suppressed. Due to this, the electric field concentration is suppressed in a semiconductor layer as well. Thus, according to this switching device, a high voltage resistance can be realized.

Figure 1:
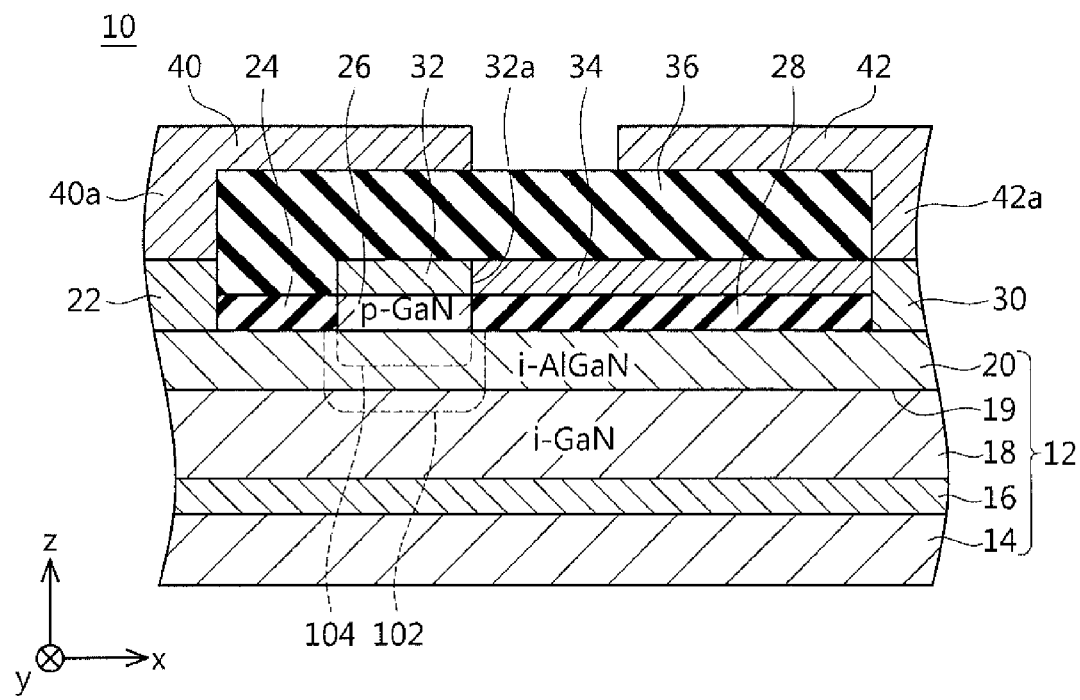
FIG. 1 is a cross sectional view of a switching device 10 of a first embodiment (a cross sectional view along a line I-I of FIG. 2)
Figure 2:
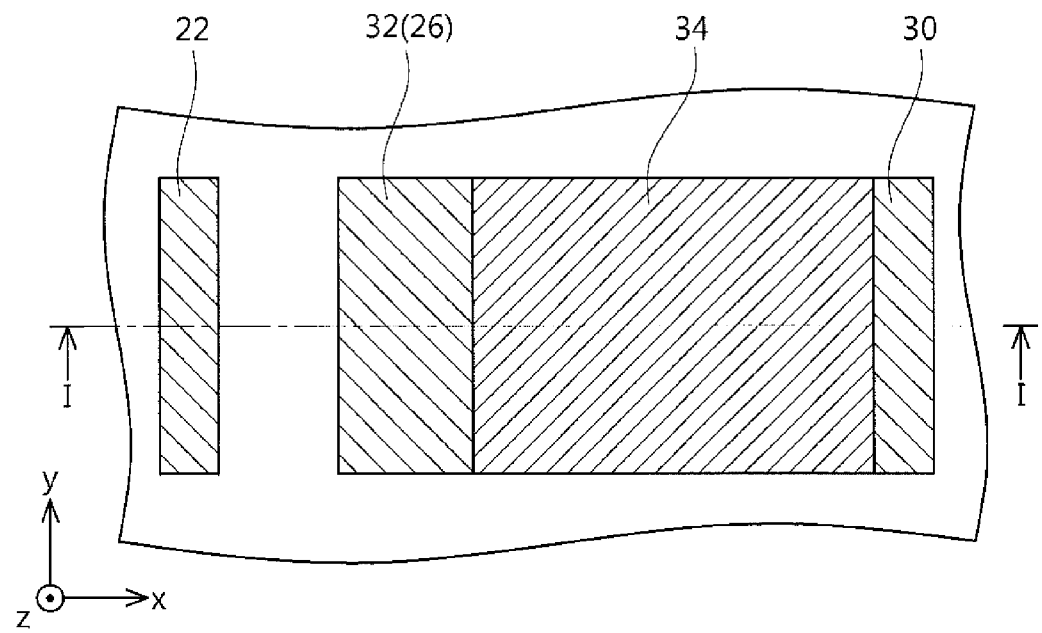
FIG. 2 is a plan view showing an arrangement of electrodes and a resistance layer when seeing the switching device 10 of the first embodiment from above (showing the electrodes and a resistance layer 34 with hatched lines for easier view)

DETAILED DESCRIPTION (First Embodiment) A switching device 10 of a first embodiment shown in FIGS. 1 and 2 is a HEMT (High Electron Mobility Transistor) that switches on and off utilizing a 2DEG generated at an interface between an electron transport layer 18 and an electron supply layer 20. The switching device 10 comprises a semiconductor substrate 12. Hereinbelow, one direction parallel to an upper surface of the semiconductor substrate 12 will be termed an x direction, a direction parallel to the upper surface of the semiconductor substrate 12 and perpendicularly intersecting the x direction will be termed a y direction, and a thickness direction of the semiconductor substrate 12 will be termed a z direction. The semiconductor substrate 12 comprises a structure in which a base substrate 14, a buffer layer 16, the electron transport layer 18, and the electron supply layer 20 are laminated. The base substrate 14, the buffer layer 16, the electron transport layer 18, and the electron supply layer 20 extend along the x direction and the y direction.

The base substrate 14 is arranged lowermost within the semiconductor substrate 12. The base substrate 14 is constituted of sapphire.

The buffer layer 16 is arranged on the base substrate 14. The buffer layer 16 is constituted of GaN.

The electron transport layer 18 is arranged on the buffer layer 16. The electron transport layer 18 is constituted of an i-type (that is, non-doped) GaN.

The electron supply layer 20 is arranged on the electron transport layer 18. The electron supply layer 20 is constituted of an i-type AlGaN. A bandgap of the electron supply layer 20 (that is, AlGaN) is wider than a bandgap of the electron transport layer 18 (that is, GaN). The electron supply layer 20 forms a heterojunction with the electron transport layer 18. A 2DEG is generated at a heterojunction 19 at an interface between the electron supply layer 20 and the electron transport layer 18.

A source electrode 22, a drain electrode 30, and a p-type layer 26 are provided on the electron supply layer 20. The source electrode 22 makes contact with an upper surface of the electron supply layer 20. The source electrode 22 is constituted of metal such as Ti Al and the like. The drain electrode 30 makes contact with the upper surface of the electron supply layer 20 at a position with an interval in the x direction from the source electrode 22. The drain electrode 22 is constituted of metal such as Ti, Al and the like. The p-type layer 26 is arranged between the source electrode 22 and the drain electrode 30 when viewed in a plan view from above. The p-type layer 26 makes contact with the upper surface of the electron supply layer 20. The p-type layer 26 is constituted of p-type GaN. Intervals are provided between the p-type layer 26 and the source electrode 22, and between the p-type layer 26 and the drain electrode 30. The upper surface of the electron supply layer 20 is covered by an insulating layer 24 at between the p-type layer 26 and the source electrode 22. The upper surface of the electron supply layer 20 is covered by an insulating layer 28 at between the p-type layer 26 and the drain electrode 30.

A gate electrode 32 is arranged on the p-type layer 26. As shown in FIG. 2, when viewed in a plan view from above, the gate electrode 32 is arranged between the source electrode 22 and the drain electrode 30. The gate electrode 32 is in contact with an upper surface of the p-type layer 26. The gate electrode 32 is constituted of metal such as Ni, Au, and the like. The gate electrode 32 is connected to a gate pad (a bonding pad) by a wiring that is not shown.

A resistance layer 34 is arranged on the insulating layer 28. The resistance layer 34 is constituted of polysilicon having a low impurity concentration. The resistance layer 34 has conductivity, however, its resistivity is high. The resistivity of the resistance layer 34 is higher than each of resistivity of the gate electrode 32 and resistivity of the drain electrode 30. The resistance layer 34 covers an entire upper surface of the insulating layer 28 located between the gate electrode 32 and the drain electrode 30. Due to this, as shown in FIG. 2, when viewed in the plan view from above, an entire region of the upper surface of the electron supply layer 20 that is between the gate electrode 32 and the drain electrode 30 overlaps with the resistance layer 34. One end of the resistance layer 34 in the x direction is in contact with the gate electrode 32, and the other end of the resistance layer 34 in the x direction is in contact with the drain electrode 30. That is, the gate electrode 32 and the drain electrode 30 are electrically connected through the resistance layer 34. An electric resistance between the gate electrode 32 and the drain electrode 30 (that is, an electric resistance between both ends of the resistance layer 34 in the x direction) is greater than an on-resistance of the switching device 10. More specifically, the electric resistance between the gate electrode 32 and the drain electrode 30 is equal to or greater than 10,000 times the on-resistance of the switching device 10.

As shown in FIG. 1, the gate electrode 32 and the resistance layer 34 are covered by an insulating layer 36. A source wiring 40 and a drain wiring 42 are arranged on the insulating layer 36. The source wiring 40 is connected to the source electrode 22 through a contact hole 40a. The drain wiring 42 is arranged at a position overlapping with the resistance layer 34 when viewed in the plan view from above. The drain wiring 42 is connected to the drain electrode 30 through a contact hole 42a.

The switching device 10 is used in a state of being serially connected to a load (for example, a motor, a reactor, and the like). The drain electrode 30 is connected to a wiring on a high-potential side, and the source electrode 22 is connected to a wiring on a low-potential side. In a case where a potential of the gate electrode 32 is lower than a threshold (for example, a few volts), a depletion layer is extending within the semiconductor substrate 12 from the p-type layer 26 as shown by a broken line 102 in FIG. 1. The depletion layer extends and reaches the heterojunction 19 under the gate electrode 32 (that is, the p-type layer 26). Due to this, no 2DEG is present in the heterojunction 19 under the gate electrode 32. Due to this, the 2DEG on a drain electrode 30 side is separated from the 2DEG on a source electrode 22 side, and thus the drain electrode 30 is electrically separated from the source electrode 22. That is, the switching device 10 is off, and thus no current flows between the drain electrode 30 and the source electrode 22. Since no current flows to the load when the switching device 10 is off, thus hardly any voltage is applied to the load. Due to this, a high potential (for example, 600V) is applied to the drain electrode 30. As aforementioned, since the potential of the gate electrode 32 is low, a high voltage is applied between the drain electrode 30 and the gate electrode 32. As a result of this, the current flows from the drain electrode 30 to the gate electrode 32 through the resistance layer 34. Since the resistivity is distributed substantially uniformly in, the resistance layer 34, thus in the state where the current is flowing in the resistance layer 34, the potential is distributed uniformly in the resistance layer 34 in a direction along which the current flows (that is, the x direction). Since the distribution of the potential in the x direction within the resistance layer 34 becomes substantially uniform, a potential is distributed substantially uniformly in the x direction in the insulating layer 28 and the electron supply layer 20 under the resistance layer 34 as well. Due to this, an electric field concentration in a vicinity of an end 32a of the gate electrode 32 on the drain electrode 30 side is mitigated. That is, the electric field concentration in the electron supply layer 20 in the vicinity of the end 32a is suppressed. Due to this, this switching device 10 is more resistant to an avalanche breakdown occurring in its semiconductor layer even if a high voltage is applied between the drain electrode 30 and the source electrode 22. Thus, the switching device 10 has a high voltage resistance.

When the potential of the gate electrode 32 is raised to a potential that is higher than the threshold, the depletion layer recedes toward a p-type layer 26 side as shown by a broken line 104 in FIG. 1. Due to this, the depletion layer recedes from the heterojunction 19. Due to this, the 2DEG is generated in the heterojunction 19 under the gate electrode 32 (that is, the p-type layer 26). Thus, the drain electrode 30 and the source electrode 22 are connected by the 2DEG. At this occasion, the current flows from the drain electrode 30 to the source electrode 22 through the 2DEG. That is, the switching device 10 turns on. When the switching device 10 is turned on, the current flows to the load, as a result of which a voltage is applied to the load. Due to this, the potential of the drain electrode 30 drops to a potential close to that of the source electrode 22. Due to this, a potential difference between the drain electrode 30 and the gate electrode 32 becomes small as well, as a result of which scarcely any current flows in the resistance layer 34.

Notably, as aforementioned, the electric resistance between the drain electrode 30 and the gate electrode 32 (that is, the electric resistance between the both ends of the resistance layer 34 in the x direction) is much higher than the on-resistance of the switching device 10. Due to this, the current that flows from the drain electrode 30 to the gate electrode 32 during when the switching device 10 is off is much smaller than the current that flows from the drain electrode 30 to the source electrode 22 during when the switching device 10 is on. In other words, a drain current (the current flowing in the resistance layer 34) during when the switching device 10 is off is small enough to be disregarded compared to the drain current during when the switching device 10 is on. Thus, a state in which the drain current flows and a state in which the drain current is substantially zero can be switched by switching the switching device 10.

Further, there is a case where the electric field changes outside of the semiconductor substrate 12. For example, there is a case where a potential of the drain wiring 42 changes, or a case where external charges (such as ions) adhere to a front surface of the switching device 10. If the electric field inside the electron supply layer 20 between the drain electrode 30 and the gate electrode 32 is disturbed by the change in the electric field external to the semiconductor substrate 12, the electric filed concentrates locally within the electron supply layer 20. However, in the switching device 10 of the first embodiment, the resistance layer 34 is arranged so as to overlap with the entire region of the upper surface of the electron supply layer 20 between the drain electrode 30 and the gate electrode 32. Since the resistance layer 34 has conductivity, the resistance layer 34 suppresses an influence of the electric field changes that took place outside the semiconductor substrate 12 from being imposed on the electron supply layer 20 which is located under the resistance layer 34. That is, the electric field concentration inside the electron supply layer 20 between the drain electrode 30 and the gate electrode 32 is suppressed by a shielding effect of the resistance layer 34. Due to this, this switching device 10 exhibits a high voltage resistance performance even in the event where the electric field external to the semiconductor substrate 12 changes. Notably, the resistance layer 34 may be arranged so as to overlap with the upper surface of the electron supply layer 20 over a larger range than the range between the drain electrode 30 and the gate electrode 32. Alternatively, the resistance layer 34 may be configured to overlap with an almost entire region of the upper surface of the electron supply layer 20 between the drain electrode 30 and the gate electrode 32 (that is, a part of the electron supply layer 20 may not overlap with the resistance layer 34). The shielding effect may be achieved even with these alternative configurations.

As described above, the switching device 10 of the first embodiment is resistant to the local electric field concentration in the semiconductor layer, and has a high voltage resistance.

Relationships of the constituent features of the first embodiment and the constituent features of the claims will be described below. The gate electrode 32 of the first embodiment is an example of a first gate electrode in the claims. The p-type layer 26 of the first embodiment is an example of a third p-type layer in the claims. The insulating layer 28 of the first embodiment is an example of a third insulating layer in the claims. The resistance layer 34 of the first embodiment is an example of a resistance layer in the claims, and is also an example of a conductive layer of the claims. The insulating layer 36 of the first embodiment is an example of a second insulating layer in the claims. The drain wiring 42 of the first embodiment is an example of a wiring arranged on the second insulating layer in the claims.

Figure 3:
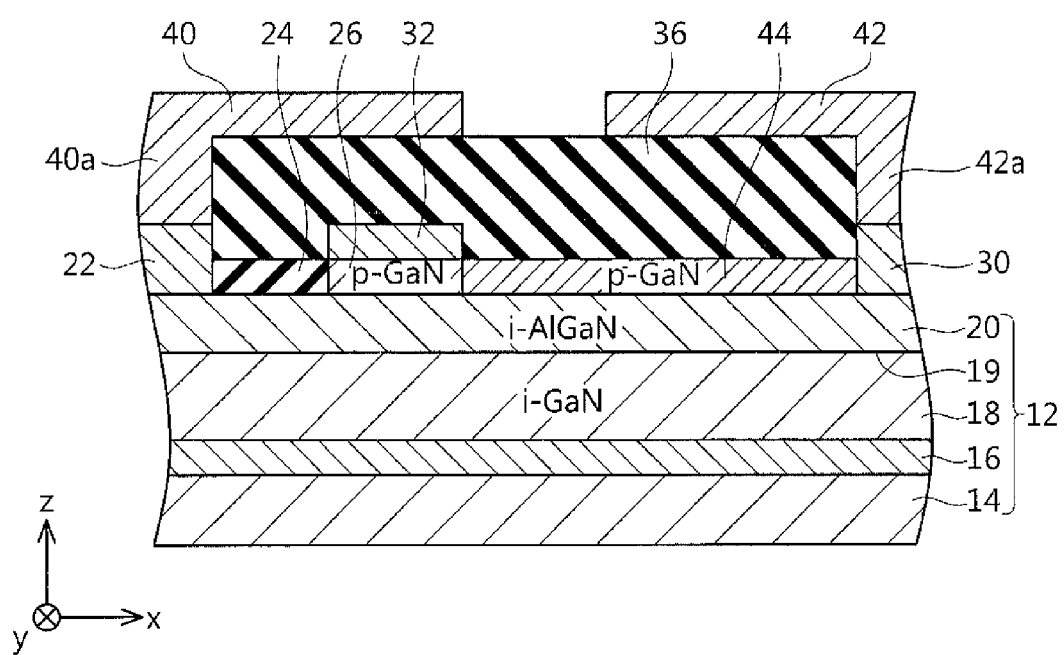
FIG. 3 is a cross sectional view of a switching device of a second embodiment.

(Second embodiment) In a switching device of a second embodiment shown in FIG. 3, no insulating layer 28 nor resistance layer 34 is arranged above the electron supply layer 20 between the drain electrode 30 and the gate electrode 32, which is different from the switching device 10 of the first embodiment. Instead of this, in the switching device of the second embodiment, a high-resistance p-type layer 44 is arranged on the electron supply layer 20 between the drain electrode 30 and the gate electrode 32. Other configurations of the switching device of the second embodiment are similar to those of the first embodiment.

The high-resistance p-type layer 44 makes contact with the electron supply layer 20. The high-resistance p-type layer 44 is constituted of p-type GaN. A p-type impurity concentration of the high-resistance p-type layer 44 is much lower than a p-type impurity concentration of the p-type layer 26. Due to this, resistivity of the high-resistance p-type layer 44 is much higher than resistivity of the p-type layer 26. The high-resistance p-type layer 44 covers the entire region of the upper surface of the electron supply layer 20 located between the drain electrode 30 and the gate electrode 32. One end of the high-resistance p-type layer 44 in the x direction is in contact with the p-type layer 26, and the other end of the high-resistance p-type layer 44 in the x direction is in contact with the drain electrode 30. The gate electrode 32 and the drain electrode 30 are electrically connected by the high-resistance p-type layer 44 and the p-type layer 26. The electric resistance between the gate electrode 32 and the drain electrode 30 is greater than an on-resistance of the switching device. More specifically, the electric resistance between the gate electrode 32 and the drain electrode 30 is equal to or greater than 10,000 times the on-resistance of the switching device.

In the switching device of the second embodiment, current flows from the drain electrode 30 to the gate electrode 32 through the p-type layer 26 and the high-resistance p-type layer 44 while the switching device is off. Due to this, a potential is distributed substantially uniformly in the x direction in the high-resistance p-type layer 44. Due to this, the potential is distributed substantially uniformly in the x direction in the electron supply layer 20 under the high-resistance p-type layer 44 as well. Due to this, the local electric filed concentration within the electron supply layer 20 can be suppressed. Further, the high-resistance p-type layer 44 provides the shielding effect. Due to this, the switching device of the second embodiment has a high voltage resistance.

A relationship of the constituent feature of the second embodiment and the constituent feature of the claims will be described. The high-resistance p-type layer 44 of the second embodiment is an example of the resistance layer in the claims.

Figure 4:
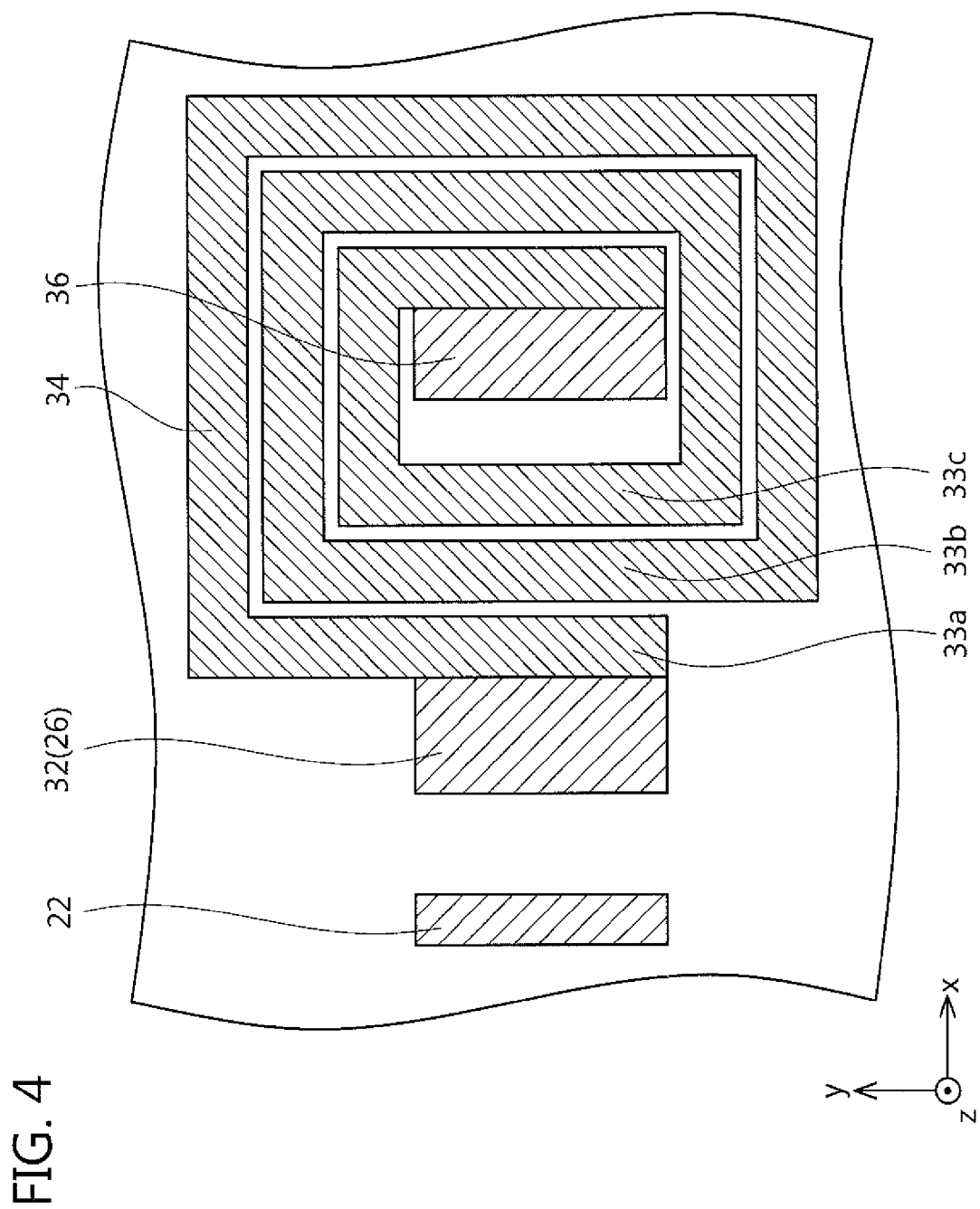
FIG. 4 is a plan view showing an arrangement of electrodes and a resistance layer when seeing a switching device of a third embodiment from above (showing the electrodes and a resistance layer 34 with hatched lines for easier view)

(Third Embodiment) In a switching device of a third embodiment shown in FIG. 4, the resistance layer 34 extends around the drain electrode 30 in a spiral shape when viewed in a plan view from above. The resistance layer 34 extending spirally connects the drain electrode 30 and the gate electrode 32. Other configurations of the switching device of the third embodiment are similar to those of the switching device of the first embodiment.

In the switching device of the third embodiment, since the resistance layer 34 (that is, a current path between the drain electrode 30 and the gate electrode 32) extends in the spiral shape, a total distance of the current path from the drain electrode 30 reaching the gate electrode 32 is longer as compared to that of the first embodiment. Due to this, in the third embodiment, the electric resistance between the drain electrode 30 and the gate electrode 32 is higher as compared to that of the first embodiment. Due to this, in the third embodiment, the current that flows in the resistance layer 34 during when the switching device is off can be made smaller than in the first embodiment. Due to this, a loss generated in the resistance layer 34 can be reduced. Further, in the third embodiment, three portions 33a, 33b, 33c of the resistance layer 34 are provided between the drain electrode 30 and the gate electrode 32. When the switching device is off, a potential of the portion 33a located closest to the gate electrode 32 is lower than a potential of the portion 33b located in the middle. Further, the potential of the portion 33b is lower than a potential of the portion 33c located closest to the drain electrode 30. That is, the potentials of the portions 33a, 33b, 33c are distributed such that they become gradually larger towards the drain electrode 30. Due to this, the potential is distributed relatively uniformly in the x direction in the region between the gate electrode 32 and the drain electrode 30. Thus, the potential is distributed relatively uniformly in the x direction in the electron supply layer 20 under the resistance layer 34 as well. Due to this, the electric field is suppressed from locally concentrating in the electron supply layer 20. Further, in the third embodiment, the resistance layer 34 does not cover the entire region between the drain electrode 30 and the gate electrode 32, and instead, gaps are provided partially in the resistance layer 34. However, even with this configuration, the shielding effect by the resistance layer 34 can be achieved. Thus, the switching device of the third embodiment has a high voltage resistance.

A relationship of the constituent feature of the third embodiment and the constituent feature of the claims will be described below. The resistance layer 34 of the third embodiment is an example of a path extending in a spiral shape (a conduction path electrically connecting the first gate electrode and the drain electrode) in the claims.

Notably, the high-resistance p-type layer 44 of the second embodiment may be configured to extend in the spiral shape around the drain electrode 30 as in the resistance layer 34 in FIG. 4.

Figure 5:
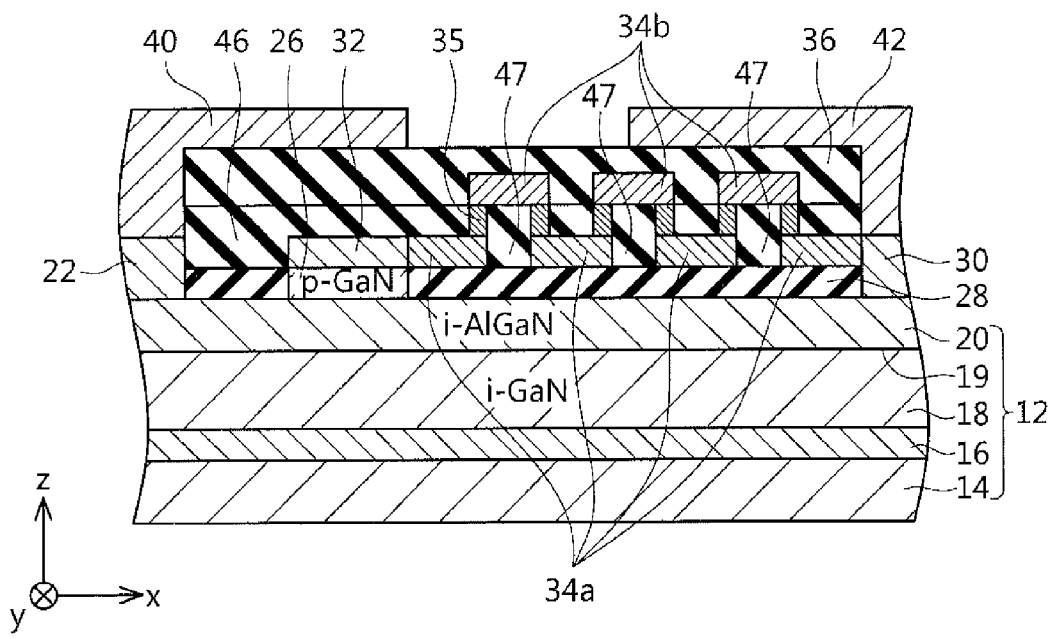
FIG. 5 is a cross sectional view of a switching device of a fourth embodiment (a cross sectional view along a line V-V of FIG. 6)
Figure 6:
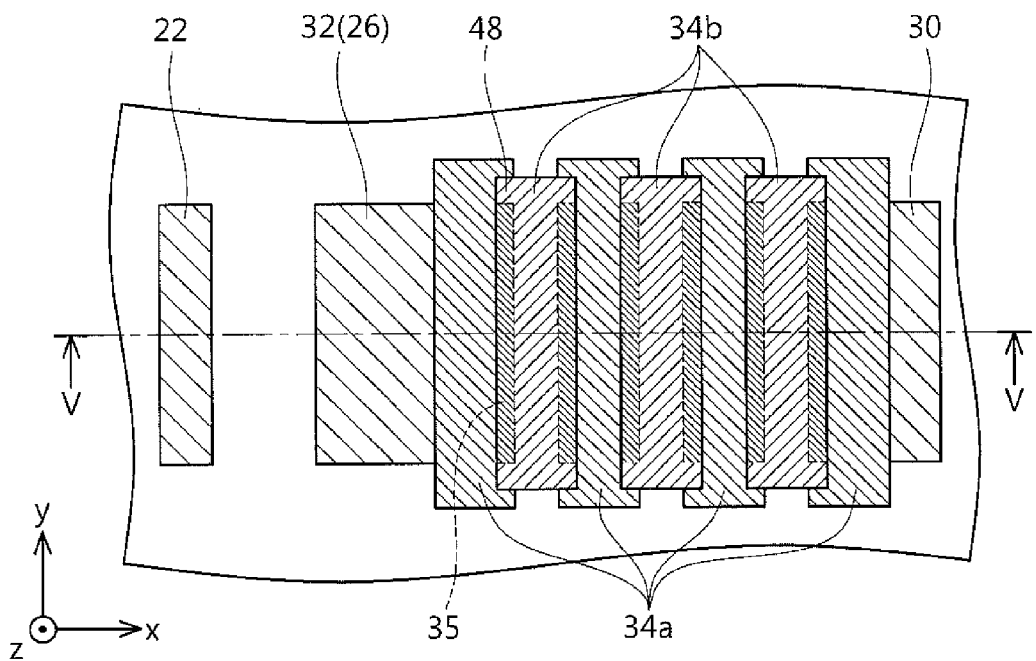
FIG. 6 is a plan view showing an arrangement of electrodes and resistance layers when seeing the switching device of the fourth embodiment from above (showing the electrodes, first resistance layers 34a, second resistance layers 34b, and contact holes 35 with hatched lines for easier view)

(Fourth Embodiment) A switching device of a fourth embodiment shown in FIGS. 5 and 6 is different from that of the first embodiment in its configuration of the resistance layer 34. Other configurations of the switching device of the fourth embodiment are similar to those of the first embodiment.

In the fourth embodiment, the resistance layer 34 comprises four first resistance layers 34a and three second resistance layers 34b. The first resistance layers 34a and the second resistance layers 34b are constituted of polysilicon. Resistivity of the first resistance layers 34a and resistivity of the second resistance layers 34b are substantially the same. Each of the resistivity of the first resistance layers 34a is higher than each of the resistivity of the gate electrode 32 and the resistivity of the drain electrode 30. Each of the resistivity of the second resistance layers 34b is higher than each of the resistivity of the gate electrode 32 and the resistivity of the drain electrode 30. The four first resistance layers 34a are arranged with intervals therebetween along the x direction on the insulating layer 28 between the gate electrode 32 and the drain electrode 30. The first resistance layer 34a located closest to the gate electrode 32 is connected to the gate electrode 32. The first resistance layer 34a located closest to the drain electrode 30 is connected to the drain electrode 30. All of the first resistance layers 34a are covered by an insulating layer 46. The three second resistance layers 34b are arranged with intervals therebetween along the x direction on the insulating layer 46. Each of the second resistance layers 34b is arranged so as to overlap with an interval portion 47 between two first resistance layers 34a when viewed in the plan view from above. Further, when viewed in the plan view from above, both ends of each of the second resistance layers 34b in the x direction are arranged so as to overlap with corresponding ends of two first resistance layers 34a that are located on both sides of the corresponding interval portion 47. A contact hole 35 is provided at each of the portions where the first resistance layers 34a and the second resistance layers 34b overlap when viewed in the plan view from above. The contact holes 35 penetrate the insulating layer 46 in the z direction. The contact holes 35 are constituted of a conductor, such as metal or polysilicon. Resistivity of the contact holes 35 is higher than each of the resistivity of the gate electrode 32 and the resistivity of the drain electrode 30. The contact holes 35 connect the corresponding first resistance layers 34a located under them and the corresponding second resistance layers 34b located above them. The gate electrode 32 and the drain electrode 30 are electrically connected through the first resistance layers 34a, the second resistance layers 34b, and the contact holes 35. The electric resistance between the gate electrode 32 and the drain electrode 30 is greater than an on-resistance of the switching device. More specifically, the electric resistance between the gate electrode 32 and the drain electrode 30 is equal to or greater than 10,000 times the on-resistance of the switching device.

In the switching device of the fourth embodiment, the current path connecting the gate electrode 32 and the drain electrode 30 is configured by the first resistance layers 34a, the second resistance layers 34b, and the contact holes 35. When the switching device is off, current flows from the drain electrode 30 to the gate electrode 32 through this current path. Due to this, the potential is distributed substantially uniformly in the x direction in this current path, as a result of which the potential is distributed substantially uniformly in the x direction in the electron supply layer 20 as well. Due to this, the electric field is suppressed from locally concentrating in the electron supply layer 20. Further, in the switching device of the fourth embodiment, the entire region of the upper surface of the electron supply layer 20 between the gate electrode 32 and the drain electrode 30 overlaps with the first resistance layers 34a and the second resistance layers 34b when viewed in the plan view from above. Due to this, a high shielding effect can be achieved. Thus, the switching device of the fourth embodiment has a high voltage resistance.

Further, in the switching device of the fourth embodiment, since the aforementioned current path is bent in an up-and-down direction, a total distance of the current path is long. Due to this, the electric resistance in the current path can be increased. Due to this, the current that flows in the current path when the switching device is off becomes small, so a loss generated in the current path can be reduced.

Further, in the switching device of the fourth embodiment, as shown in FIG. 6, the second resistance layers 34b overlap with the first resistance layers 34a at portions 48 that are adjacent to the contact holes 35 in the y direction when viewed in the plan view from above. As above, with the second resistance layers 34b overlapping with the first resistance layers 34a at portions other than the contact holes 35, a high shielding effect can be achieved. Due to this, the voltage resistance of the switching device of the fourth embodiment is further improved.

Notably, in the aforementioned fourth embodiment, the first resistance layer 34a located closest to the gate electrode 32 is connected to the gate electrode 32. However, the second resistance layer 34b may be arranged closest to the gate electrode 32, and this second resistance layer 34b may be connected to the gate electrode 32. Further, in the aforementioned fourth embodiment, the first resistance layer 34a located closest to the drain electrode 30 is connected to the drain electrode 30. However, the second resistance layer 34b may be arranged closest to the drain electrode 30, and this second resistance layer 34b may be connected to the drain electrode 30.

Relationships of the constituent features of the fourth embodiment and the constituent features of the claims will be described below. The first resistance layers 34a of the fourth embodiment are an example of a first resistance layer in the claims. The insulating layer 46 of the fourth embodiment is an example of a first insulating layer in the claims. The second resistance layers 34b of the fourth embodiment are an example of a second resistance layer in the claims. The contact holes 35 of the fourth embodiment are an example of a contact hole in the claims. The portions 48 of the fourth embodiment are an example of a portion of the second resistance layer overlapping with the first resistance layer at a position at which the contact hole is not provided in the claims.

Figure 7:
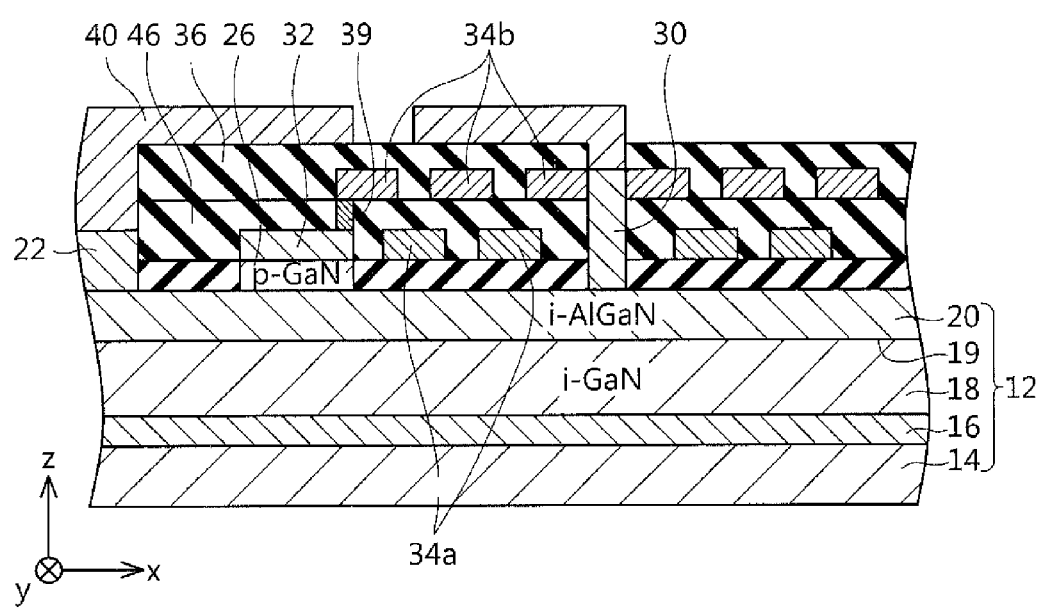
FIG. 7 is a cross sectional view of a switching device of a fifth embodiment (a cross sectional view along a line VII-VII of FIG. 8)
Figure 8:
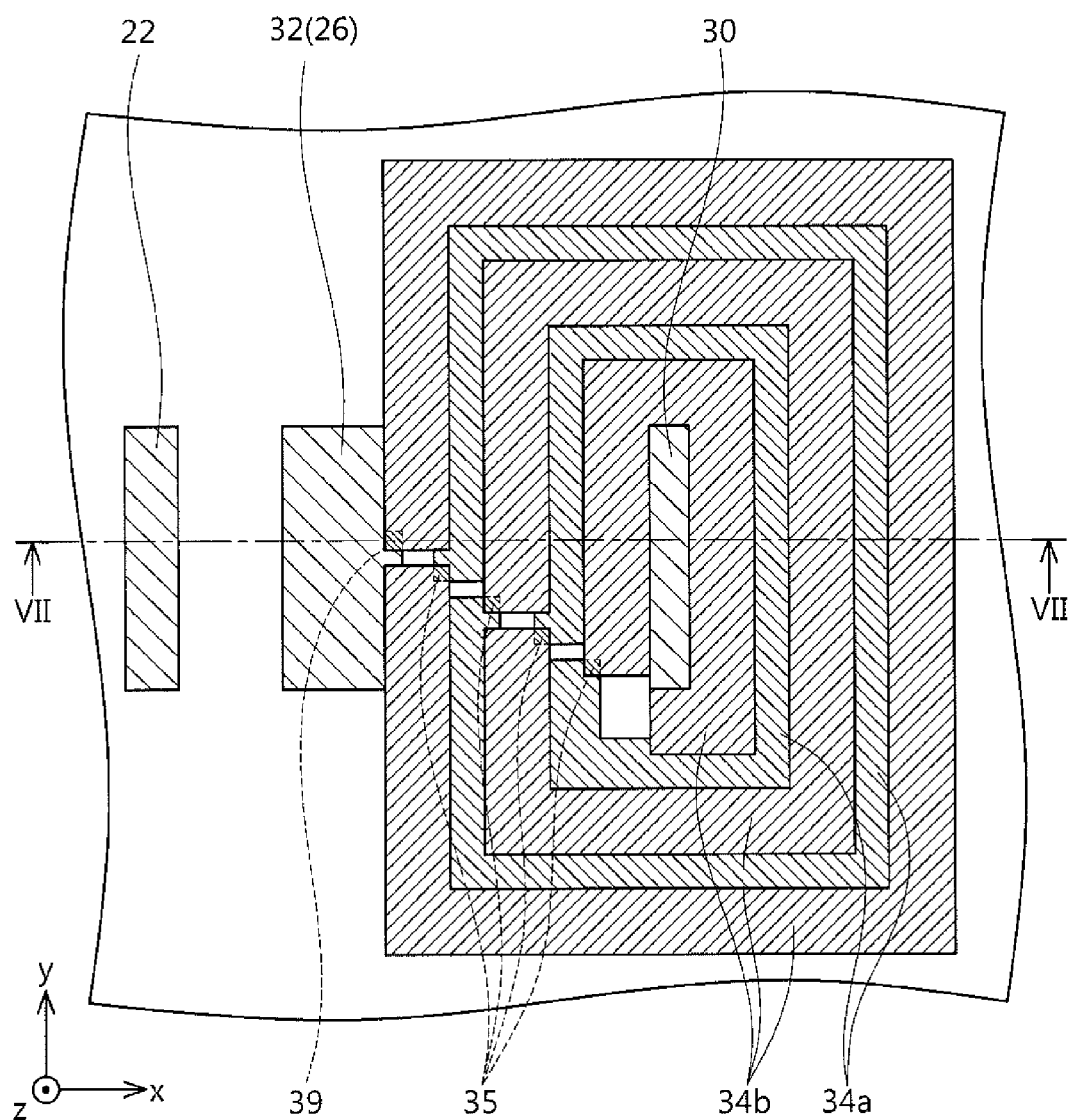
FIG. 8 is a plan view showing an arrangement of electrodes and resistance layers when seeing the switching device of the fifth embodiment from above (showing the electrodes, first resistance layers 34a, second resistance layers 34b, and contact holes 35, 39 with hatched lines for easier view)

(Fifth Embodiment) In a switching device of a fifth embodiment shown in FIGS. 7 and 8, an arrangement of the first resistance layers 34a and the second resistance layers 34b is different from that of the fourth embodiment. Other configurations of the switching device of the fifth embodiment are similar to those of the fourth embodiment.

The switching device of the fifth embodiment comprises two first resistance layers 34a and three second resistance layers 34b. When viewed in the plan view from above, the three second resistance layers 34b extend in substantially C-shapes surrounding a periphery of the drain electrode 30. Gaps are provided between the second resistance layers 34b. The second resistance layer 34b located closest to the drain electrode 30 is connected to the drain electrode 30. The second resistance layer 34b located closest to the gate electrode 32 is connected to the gate electrode 32 by a contact hole 39. When viewed in the plan view from above, the two first resistance layers 34a extend in substantially C-shapes surrounding the periphery of the drain electrode 30. A gap is provided between the first resistance layers 34a. Each of the first resistance layers 34a is arranged so that it overlaps with the second resistance layers 34b at its both ends when viewed in the plan view from above. The contact holes 35 are provided at the portions where the first resistance layers 34a and the second resistance layers 34b overlap with each other (both ends of each of the first resistance layers 34a) when viewed in the plan view from above. The contact holes 35 penetrate the insulating layer 46 in the z direction. The contact holes 35 connect the corresponding first resistance layers 34a located under them and the corresponding second resistance layers 34b located above them. The gate electrode 32 and the drain electrode 30 are electrically connected through the first resistance layers 34a, the second resistance layers 34b, and the contact holes 35. That is, the current path between the gate electrode 32 and the drain electrode 30 is configured by the first resistance layers 34a, the second resistance layers 34b, and the contact holes 35. This current path extends in the spiral shape around the drain electrode 30 when viewed in the plan view from above. The electric resistance of this current path (that is, the electric resistance between the gate electrode 32 and the drain electrode 30) is larger than an on-resistance of the switching device. More specifically, the electric resistance of this current path is equal to or greater than 10,000 times the on-resistance of the switching device.

Since the gate electrode 32 and the drain electrode 30 are connected by the current path (that is, the current path configured of the first resistance layers 34a, the second resistance layers 34b, and the contact holes 35) in the switching device of the fifth embodiment as well, the electric field concentration in the electron supply layer 20 between the gate electrode 32 and the drain electrode 30 can be suppressed. Further, in the switching device of the fifth embodiment as well, when viewed in the plan view from above, most part of the upper surface of the electron supply layer 20 located between the gate electrode 32 and the drain electrode 30 overlaps with the first resistance layers 34a and the second resistance layers 34b. Due to this, the shielding effect can be achieved in the switching device of the fifth embodiment as well. Thus, the switching device of the fifth embodiment has a high voltage resistance.

Further, in the switching device of the fifth embodiment, the current path connecting the gate electrode 32 and the drain electrode 30 extends in the spiral shape around the drain electrode 30, and is bent in the up-and-down direction. Due to this, in the switching device of the fifth embodiment, a total distance of the current path is long, and the electric resistance of the current path is high. Due to this, in the fifth embodiment, the current that flows in the current path when the switching device is off is small, so a loss generated in the current path can be reduced.

Relationships of the constituent features of the fifth embodiment and the constituent features of the claims will be described below. The first resistance layers 34a of the fifth embodiment are an example of the first resistance layer in the claims. The insulating layer 46 of the fifth embodiment is an example of the first insulating layer in the claims. The second resistance layers 34b of the fifth embodiment are an example of the second resistance layer in the claims. The contact holes 35 of the fifth embodiment are an example of the contact hole in the claims. The current path configured of the first resistance layers 34a, the second resistance layers 34b, and the contact holes 35 of the fifth embodiment is an example of the path extending in the spiral shape around the drain electrode in the claims.

Figure 9:
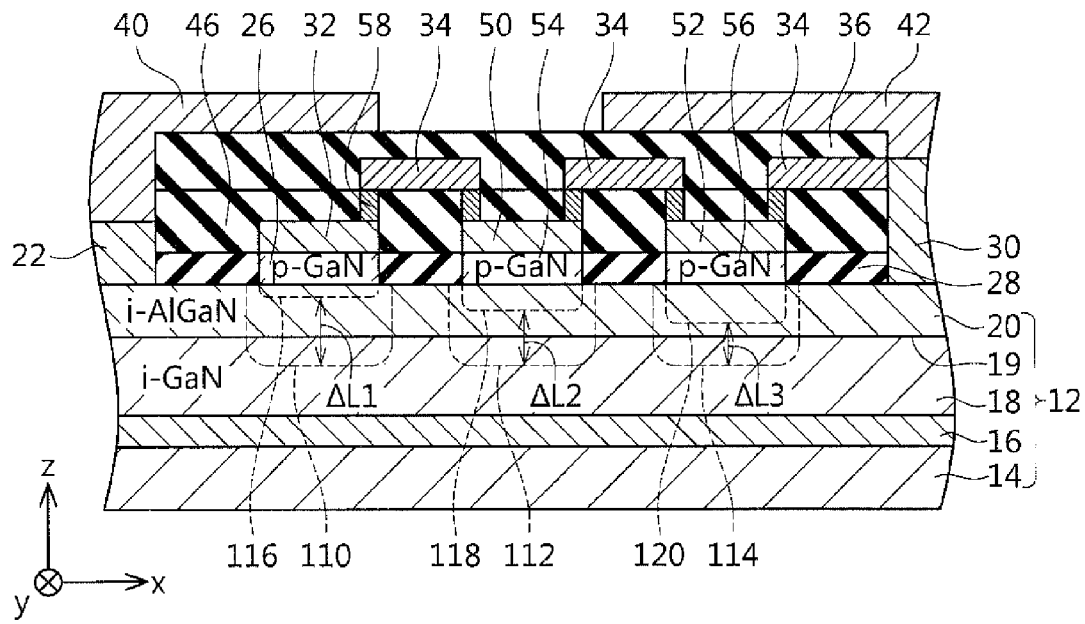
FIG. 9 is a vertical cross sectional view of a switching device of a sixth embodiment.

(Sixth Embodiment) A switching device of a sixth embodiment shown in FIG. 9 comprises two gate electrodes 50, 52 between the gate electrode 32 and the drain electrode 30. The gate electrode 50 is arranged between the gate electrode 32 and the drain electrode 30. The gate electrode 52 is arranged between the gate electrode 50 and the drain electrode 30. That is, three gate electrodes, namely the gate electrode 32, the gate electrode 50, and the gate electrode 52, are arranged next to each other from the source electrode 22 toward the drain electrode 30 in this order. The gate electrodes 50, 52 are constituted of the same metal as the gate electrode 32. A p-type layer 54 is arranged under the gate electrode 50. The p-type layer 54 is arranged between the gate electrode 50 and the electron supply layer 20. The p-type layer 54 is in contact with the electron supply layer 20 by its lower surface, and is in contact with the gate electrode 50 by its upper surface. A p-type layer 56 is arranged under the gate electrode 52. The p-type layer 56 is arranged between the gate electrode 52 and the electron supply layer 20. The p-type layer 56 is in contact with the electron supply layer 20 by its lower surface, and is in contact with the gate electrode 52 by its upper surface. The p-type layers 54, 56 are constituted of the p-type GaN having the same composition as the p-type layer 26.

In the switching device of the sixth embodiment, the resistance layer 34 is separated into three. The resistance layer 34 located closest to the gate electrode 32 is connected to the gate electrode 32 at its one end in the x direction through a contact hole 58, and is connected to the gate electrode 50 at its other end in the x direction through another contact hole 58. The resistance layer 34 located in the middle among the three resistance layers 34 is connected to the gate electrode 50 at its one end in the x direction through a contact hole 58, and is connected to the gate electrode 52 at its other end in the x direction through another contact hole 58. The resistance layer 34 located closest to the drain electrode 30 is connected to the gate electrode 52 at its one end in the x direction through a contact hole 58, and is connected to the drain electrode 30 at its other end in the x direction through another contact hole 58.

The gate electrode 32 is electrically connected to the drain electrode 30 by the resistance layers 34, the gate electrodes 50, 52, and the contact holes 58. That is, a current path connecting the gate electrode 32 and the drain electrode 30 is configured by the resistance layers 34, the gate electrodes 50, 52, and the contact holes 58. Other configurations of the switching device of the sixth embodiment are similar to those of the first embodiment.

In the switching device of the sixth embodiment as well, current flows in the aforementioned current path when the switching device is off, thus the potential is relatively uniformly distributed in the x direction in the current path. Due to this, the electric field concentration in the electron supply layer 20 is suppressed. Further, in the switching device of the sixth embodiment, the shielding effect by the resistance layers 34 and the gate electrodes 50, 52 can be achieved. Thus, the switching device of the sixth embodiment has a high voltage resistance.

Figure 10:
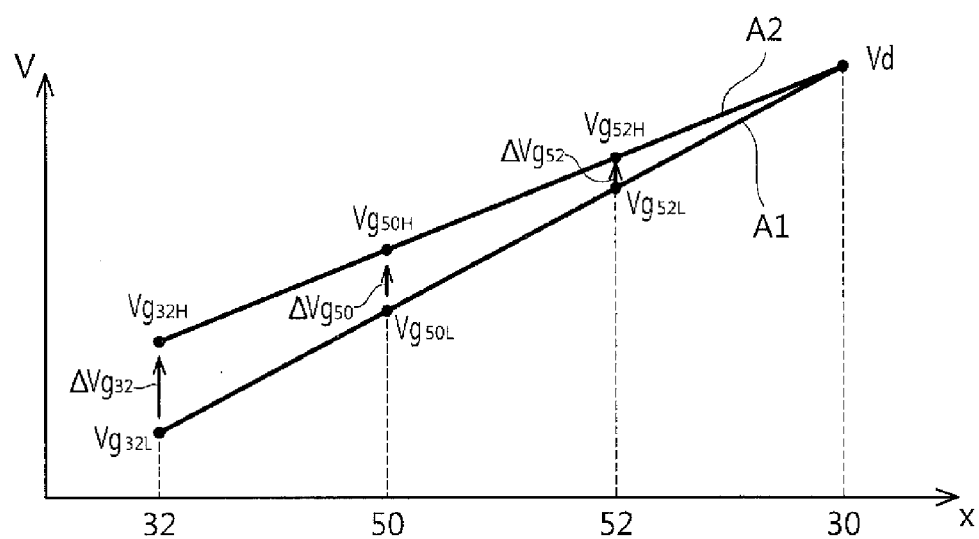
FIG. 10 is a graph showing potentials of electrodes of the sixth embodiment.

Next, potentials of the gate electrodes 32, 50, and 52 when the switching device of the sixth embodiment is off will be described with reference to FIG. 10. In FIG. 10, a potential Vd of the drain electrode 30 is a fixed potential (about 600V). A graph A1 in FIG. 10 shows a case where a low potential $Vg_{32L}$ (for example, 0V) is applied to the gate electrode 32. Since current flows in the aforementioned current path in the state where the switching device is off, the potential becomes higher on an upper stream side of the current path (that is, a drain electrode 30 side). Due to this, as shown in the graph A1, if the potential $Vg_{32L}$ is applied to the gate electrode 32, the potential of the gate electrode 50 becomes a potential $Vg_{50L}$ (for example, 200V) that is higher than the potential $Vg_{32L}$ of the gate electrode 32. Further, at this occasion, the potential of the gate electrode 52 becomes a potential $Vg_{52L}$ (for example, 400V) that is higher than the potential $Vg_{50L}$ of the gate electrode 50 and lower than the potential Vd of the drain electrode 30. That is, the potential rises proportionally from the gate electrode 32 toward the drain electrode 30. Next, as shown in a graph A2, a case where the potential of the gate electrode 32 is raised from $Vg_{32L}$ to $Vg_{32H}$ will be considered. Notably, the potential $Vg_{32H}$ is a potential lower than a threshold. Thus, even in a state where the potential shown in the graph A2 is applied, the switching device is off, and the potential Vd of the drain electrode 30 is maintained at the high potential (about 600V). When the potential of the gate electrode 32 is raised to $Vg_{32H}$, the potential of the gate electrode 50 rises from $Vg_{50L}$ to $Vg_{50H}$, and the potential of the gate electrode 52 rises from $Vg_{52L}$ to $Vg_{52H}$. As above, when the potential of the gate electrode 32 is raised, the potentials of the gate electrodes 50, 52 rise accompanying therewith. In the graph A2 as well, the potential rises proportionally from the gate electrode 32 toward the drain electrode 30. Since the potential Vd of the drain electrode 30 remains unchanged but the potential of the gate electrode 32 rises, a rising amplitude $\Delta Vg_{50}$ of the potential of the gate electrode 50 is smaller than a rising amplitude $\Delta Vg_{32}$ of the potential of the gate electrode 32, and a rising amplitude $\Delta Vg_{52}$ of the potential of the gate electrode 52 is smaller than the rising amplitude $\Delta Vg_{50}$ of the potential of the gate electrode 50. As above, if the potential of the gate electrode 32 is raised in the state where the switching device is off, the rising amplitude of the potential of the gate electrode 50 becomes smaller than the rising amplitude of the potential of the gate electrode 32, and the rising amplitude of the potential of the gate electrode 52 becomes smaller than the rising amplitude of the potential of the gate electrode 50.

In the state where the potential $Vg_{32L}$ is applied to the gate electrode 32 (that is, the state of the graph A1 in FIG. 10), the potential is distributed in the electron supply layer 20 substantially similar to the potential distributions in the gate electrodes 32, 50, 52 (that is, the graph A1). Due to this, a voltage applied to the interfaces between each of the p-type layers 26, 54, 56 and the electron supply layer 20 is extremely low. In this state, depletion layers extend from the p-type layers 26, 54, 56 to the electron supply layer 20. As shown by a broken line 110 in FIG. 9, the depletion layer reaches the heterojunction 19 under the p-type layer 26. Thus, no 2DEG is present under the p-type layer 26. As shown by a broken line 112, the depletion layer reaches the heterojunction 19 under the p-type layer 54. Thus, no 2DEG is present under the p-type layer 54. As shown by a broken line 114, the depletion layer reaches the heterojunction 19 under the p-type layer 56. Thus, no 2DEG is present under the p-type layer 56.

Next, a case will be considered in which the potential of the gate electrode 32 is raised to a potential higher than the threshold (to a potential higher than the potential $Vg_{32H}$ in FIG. 10). In so doing, as shown by a broken line 116 in FIG. 9, the depletion layer under the p-type layer 26 recedes away from the heterojunction 19, and a 2DEG is generated in the heterojunction 19 under the p-type layer 26. Further, when the potential of the gate electrode 32 is raised, the potentials of the gate electrodes 50, 52 rise together therewith. Due to this, as shown by a broken line 118 in FIG. 9, the depletion layer under the p-type layer 54 recedes away from the heterojunction 19, and a 2DEG is generated in the heterojunction 19 under the p-type layer 54. Further, as shown by a broken line 120 in FIG. 9, the depletion layer under the p-type layer 56 recedes away from the heterojunction 19, and a 2DEG is generated in the heterojunction 19 under the p-type layer 56. Notably, as mentioned above, the rising amplitude of the potential is largest in the gate electrode 32 and is smallest in the gate electrode 52. Due to this, distances by which the depletion layers recede (distances $\Delta L1$, $\Delta L2$, $\Delta L3$ in FIG. 9) become longest under the gate electrode 32 and become shortest under the gate electrode 52. This switching device turns on by raising the potential of the gate electrode 32 to a potential that is sufficient for the depletion layer to recede from the heterojunction 19 under the gate electrode 52.

As described above, in the switching device of the sixth embodiment, the 2DEG is depleted at three positions by the three gate electrodes 32, 50, 52 in the off state. Due to this, a voltage resistance of the switching device can further be improved.

Relationships of the constituent features of the sixth embodiment and the constituent features of the claims will be described below. The gate electrode 32 of the sixth embodiment is an example of the first gate electrode in the claims. The gate electrodes 50, 52 of the sixth embodiment are an example of the second gate electrode in the claims. The p-type layer 26 of the sixth embodiment is an example of a first p-type layer in the claims. The p-type layers 54, 56 of the sixth embodiment are an example of a second p-type layer in the claims. Further, the gate electrode 50 of the sixth embodiment may be regarded as an example of the first gate electrode of the claims, and the gate electrode 52 may be regarded as an example of the second gate electrode of the claims. In this case, the p-type layer 54 of the sixth embodiment is an example of the first p-type layer in the claims, and the p-type layer 56 of the sixth embodiment is an example of the second p-type layer in the claims.

Notably, in the configuration of the sixth embodiment, when the potential of the gate electrode 32 is raised, the depletion layers under the p-type layers 26, 54 recede from the heterojunction 19 before the depletion layer under the p-type layer 56 does. The depletion layer under the p-type layer 56 takes more time to recede from the heterojunction 19, and thus there may be a problem that the electric field tends to concentrate under the p-type layer 56 in the switching process. Further, there may be a problem that a resistance of the 2DEG becomes high under the p-type layer 56 when the switching device is on. Switching devices of seventh to ninth embodiments described below provides solutions to these problems.

Figure 11:
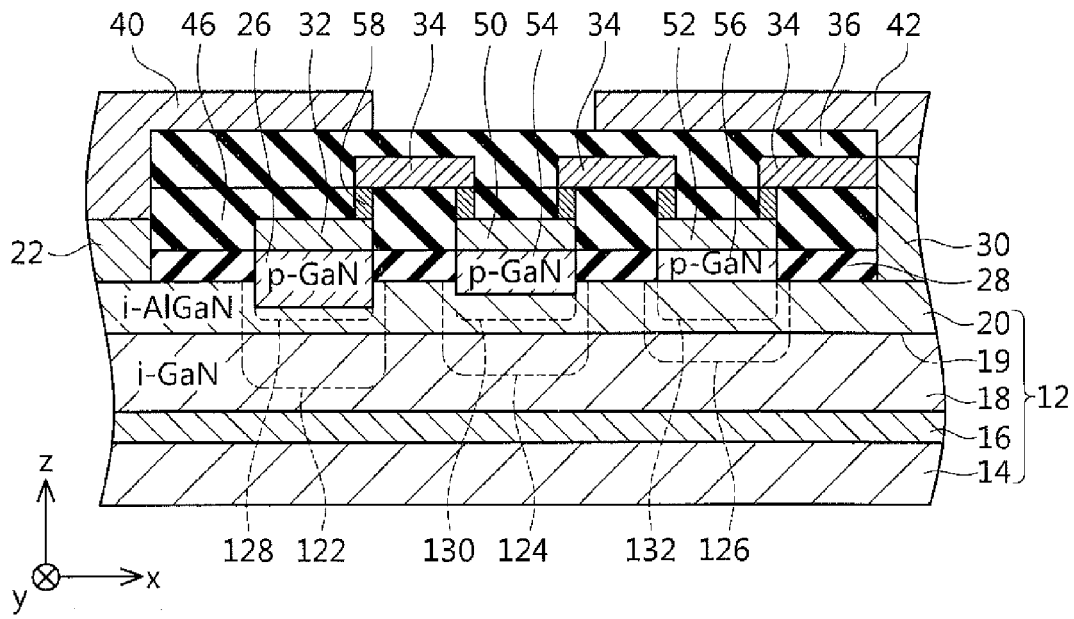
FIG. 11 is a vertical cross sectional view of a switching device of a seventh embodiment.

(Seventh Embodiment) A switching device of a seventh embodiment shown in FIG. 11 is different from that of the sixth embodiment in thicknesses of the electron supply layer 20 between each of the p-type layers 26, 54, 56 and the electron transport layer 18. Other configurations of the switching device of the seventh embodiment are similar to those of the sixth embodiment.

In the switching device of the seventh embodiment, the thickness of the electron supply layer 20 between the p-type layer 26 and the electron transport layer 18 is thinner than the thickness of the electron supply layer 20 between the p-type layer 54 and the electron transport layer 18. Further, the thickness of the electron supply layer 20 between the p-type layer 54 and the electron transport layer 18 is thinner than the thickness of the electron supply layer 20 between the p-type layer 56 and the electron transport layer 18. Due to this, in a state where the switching device of the seventh embodiment is off, depletion layers extend under the p-type layers 26, 54, and 56 as shown by broken lines 122 to 126 in FIG. 11. At this occasion, a width by which the respective depletion layers extend downward is substantially identical among the p-type layers 26, 54, 56. Due to this, the depletion layer extends further downward under the p-type layer 54 than under the p-type layer 56, and the depletion layer extends further downward under the p-type layer 26 than under the p-type layer 54. Similar to the sixth embodiment, the heterojunction 19 is depleted under the p-type layers 26, 54, and 56 (that is, at three positions). Further, similar to the sixth embodiment, the electric field concentration in the electron supply layer 20 is suppressed by the current path between the gate electrode 32 and the drain electrode 30. Thus, this switching device has a high voltage resistance.

When the potential of the gate electrode 32 is raised, the depletion layer under the p-type layer 26 recedes away from the heterojunction 19 as shown by a broken line 128 in FIG. 11. Further, accompanying the rise in the potential of the gate electrode 32, the potentials of the gate electrodes 50, 52 also rise. Due to this, as shown by broken lines 130, 132 in FIG. 11, the depletion layers under the p-type layers 54, 56 also recede away from the heterojunction 19. At this occasion, as aforementioned, the distance by which the depletion layer recedes under the p-type layer 56 is smaller as compared to those for the depletion layers under the p-type layers 26, 54. Further, the distance by which the depletion layer recedes under the p-type layer 54 is smaller as compared to that for the depletion layer under the p-type layer 26. Thus, as shown by the broken lines 128, 130, 132, positions of lower ends of the depletion layers after the recession become substantially same. As above, when the positions of the lower ends of the depletion layers after the recession become substantially same, upon raising the potential of the gate electrode 32, the depletion layers under the p-type layers 26, 54, 56 recede from the heterojunction 19 at closer timings to each other. That is, the 2DEG can be generated under the p-type layers 26, 54, 56 at closer timings to each other. Thus, the state in which the depletion layer has not receded from the heterojunction 19 only under the p-type layer 56 is less likely to occur. Due to this, the problems mentioned in the aforementioned sixth embodiment can be solved.

Figure 12:
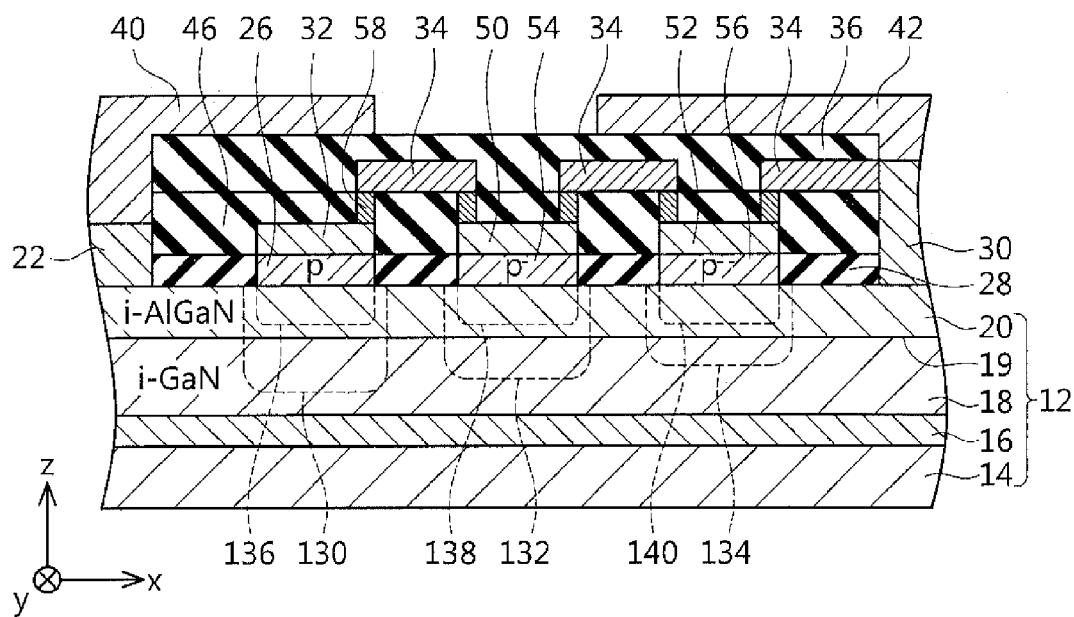
FIG. 12 is a vertical cross sectional view of a switching device of an eighth embodiment.

(Eighth Embodiment) A switching device of an eighth embodiment shown in FIG. 12 is different from that of the sixth embodiment in p-type impurity concentrations of the p-type layers 26, 54, 56. In the switching device of the eighth embodiment, the p-type impurity concentration of the p-type layer 26 is the highest among the p-type layers 26, 54, 56, and the p-type impurity concentration of the p-type layer 56 is the lowest thereamong. Other configurations of the switching device of the eighth embodiment are similar to those of the sixth embodiment.

The switching device of the eighth embodiment operates similar to that of the sixth embodiment except for the distances by which the depletion layers extend. Due to this, in the eighth embodiment as well, similar to the sixth embodiment, the heterojunction 19 is depleted under the p-type layers 26, 54, and 56 (that is, at three positions). Further, similar to the sixth embodiment, the electric field concentration in the electron supply layer 20 is suppressed by the current path between the gate electrode 32 and the drain electrode 30. Thus, this switching device has a high voltage resistance.

Further, in the switching device of the eighth embodiment, the p-type impurity concentration becomes lower from the p-type layer 26, the p-type layer 54, and to the p-type layer 56 in this order. The depletion layer easily extends from the p-type layer 26 having the high p-type impurity concentration to the electron supply layer 20, and the depletion layer extends less easily from the p-type layer 56 having the low p-type impurity concentration to the electron supply layer 20. Thus, in the state where the switching device of the eighth embodiment is off, as shown by broken lines 130 to 134 in FIG. 12, the depletion layer extends further downward under the p-type layer 54 than under the p-type layer 56, and the depletion layer extends further downward under the p-type layer 26 than under the p-type layer 54. When the potential of the gate electrode 32 is raised, the depletion layer under the p-type layer 26 recedes away from the heterojunction 19 as shown by a broken line 136 in FIG. 12. Further, accompanying the rise in the potential of the gate electrode 32, the potentials of the gate electrodes 50, 52 also rise. Due to this, as shown by broken lines 138, 140 in FIG. 12, the depletion layers under the p-type layers 54, 56 also recede away from the heterojunction 19. At this occasion, the distance by which the depletion layer recedes under the p-type layer 56 is smaller as compared to those for the depletion layers under the p-type layers 26, 54. Further, the distance by which the depletion layer recedes under the p-type layer 54 is smaller as compared to that for the depletion layer under the p-type layer 26. Thus, as shown by the broken lines 136, 138, 140, positions of lower ends of the depletion layers after the recession become substantially same. As above, when the positions of the lower ends of the depletion layers after the recession become substantially same, upon raising the potential of the gate electrode 32, the depletion layers under the p-type layers 26, 54, 56 recede from the heterojunction 19 at closer timings to each other. The state in which the depletion layer has not receded from the heterojunction 19 only under the p-type layer 56 is less likely to occur. Due to this, the problems mentioned in the aforementioned sixth embodiment can be solved.

Figure 13:
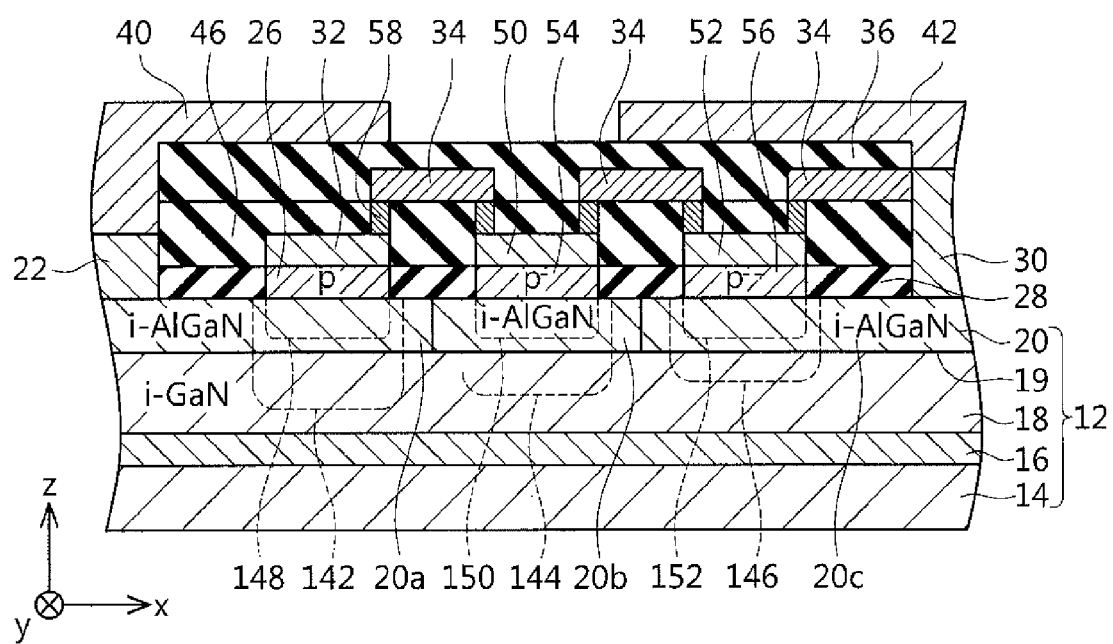
FIG. 13 is a vertical cross sectional view of a switching device of a ninth embodiment.

(Ninth Embodiment) A switching device of a ninth embodiment shown in FIG. 13 is different from the switching device of the sixth embodiment in that its electron supply layer 20 comprises three layers 20a to 20c having different compositions. Other configurations of the switching device of the ninth embodiment are similar to those of the sixth embodiment.

In the switching device of the ninth embodiment, a first layer 20a is arranged under the p-type layer 26, a second layer 20b is arranged under the p-type layer 54, and a third layer 20c is arranged under the p-type layer 56. The electron supply layer 20 is configured by these three layers 20a to 20c adjoining in a lateral direction. The first layer 20a is constituted of $Al_{x1}Ga_{1-x1}N$. The second layer 20b is constituted of $Al_{x2}Ga_{1-x2}N$. The third layer 20c is constituted of $Al_{x3}Ga_{1-x3}N$. Values x1, x2, x3 satisfy a relationship of x1<x2<x3. An Al/Ga ratio N1 (ratio of Al relative to Ga (molar ratio)) in the first layer 20a is expressed by $N1=x1/(1-x1)$, an Al/Ga ratio N2 in the second layer 20b is expressed by $N2=x2/(1-x2)$, and an Al/Ga ratio N3 in the third layer 20c is expressed by $N3=x3/(1-x3)$. Since x1<x2<x3 is satisfied, N1<N2<N3 is thereby satisfied.

The switching device of the ninth embodiment operates similar to that of the sixth embodiment except for the distances by which the depletion layers extend. Due to this, in the ninth embodiment as well, similar to the sixth embodiment, the heterojunction 19 is depleted under the p-type layers 26, 54, and 56 (that is, at three positions). Further, similar to the sixth embodiment, the electric field concentration in the electron supply layer 20 is suppressed by the current path between the gate electrode 32 and the drain electrode 30. Thus, this switching device has a high voltage resistance.

Further, in the switching device of the ninth embodiment, the Al/Ga ratio becomes higher from the first layer 20a, the second layer 20b, and to the third layer 20c in this order. The higher the Al/Ga ratio is, the less easily the depletion layer extends in the electron supply layer 20. Thus, in a state where the switching device of the ninth embodiment is off, as shown by broken lines 142 to 146 in FIG. 13, the depletion layer extends further downward under the p-type layer 54 than under the p-type layer 56, and the depletion layer extends further downward under the p-type layer 26 than under the p-type layer 54. When the potential of the gate electrode 32 is raised, the depletion layer under the p-type layer 26 recedes away from the heterojunction 19 as shown by a broken line 148 in FIG. 13. Further, accompanying the rise in the potential of the gate electrode 32, the potentials of the gate electrodes 50, 52 also rise. Due to this, as shown by broken lines 150, 152 in FIG. 13, the depletion layers under the p-type layers 54, 56 also recede away from the heterojunction 19. At this occasion, the distance by which the depletion layer recedes under the p-type layer 56 is smaller as compared to those for the depletion layers under the p-type layers 26, 54. Further, the distance by which the depletion layer recedes under the p-type layer 54 is smaller as compared to that for the depletion layer under the p-type layer 26. Thus, as shown by the broken lines 148, 150, 152, positions of lower ends of the depletion layers after the recession become substantially same. As above, when the positions of the lower ends of the depletion layers after the recession become substantially same, upon raising the potential of the gate electrode 32, the depletion layers under the p-type layers 26, 54, 56 recede from the heterojunction 19 at closer timings to each other. The state in which the depletion layer has not receded from the heterojunction 19 only under the p-type layer 56 is less likely to occur. Due to this, the problems mentioned in the aforementioned sixth embodiment can be solved.

Notably, in the aforementioned sixth to ninth embodiments, the current path between the gate electrode 32 and the drain electrode 30 may be configured to extend in the spiral shape around the drain electrode 30 as shown in FIGS. 7 and 8.

Further, the features mentioned in the seventh to ninth embodiments may be combined. Due to this, the depletion layer under the p-type layer 56 can more easily recede away from the heterojunction 19.

Notably, in the aforementioned first to ninth embodiments, varieties of the switching device in which the p-type layers are arranged between the gate electrode and the electron supply layer have been described. However, the gate electrode may be in direct contact (for example, by a Schottky contact) with the electron supply layer. Further, an insulating film may be provided between the gate electrode and the electron supply layer. In these configurations, the switching device becomes the normally-on type due to the gate threshold becoming lower than 0V. Aside from the fact that the gate threshold is different, such configurations can realize the operations similar to those of the aforementioned first to ninth embodiments.

Further, in the aforementioned first to ninth embodiments, varieties of the switching device in which the 2DEG is generated in the heterojunction have been described. However, the technique disclosed herein may be applied to a switching device in which 2DHG is generated at the heterojunction. In the case of the switching device using 2DHG, it turns off when the gate potential is raised, and turns on when the gate potential is lowered. Aside from this point, such configuration can realize the operations similar to those of the aforementioned first to ninth embodiments.

Further, in the aforementioned first to ninth embodiments, the drain wiring 42 is arranged on the resistance layer 34. However, the wiring to be arranged on the resistance layer 34 may be other wirings (for example, gate wiring, source wiring, signal wiring, and the like). Even with this configuration, the influence of the electric field from the wiring to the electron supply layer can be suppressed by the resistance layer 34.

Preferable configurations of the aforementioned embodiments will be listed below. Notably, each of the below-listed configurations has independent usefulness.

In a configuration disclosed herein as an example, the switching device may further comprise a resistance layer provided above the electron supply layer, provided between the first gate electrode and the drain electrode when viewed in the plan view from above, and having resistivity higher than resistivity of the first gate electrode and the drain electrode. At least a part of a conduction path electrically connecting the first gate electrode and the drain electrode is constituted of the resistance layer.

According to this configuration, the potential is distributed substantially uniformly within the resistance layer during when the switching device is off. Due to this, the electric field concentration can effectively be suppressed.

In a configuration disclosed herein as an example, the switching device may further comprise a first insulating layer. Further, the resistance layer may comprise a first resistance layer and a second resistance layer. The first insulating layer covers the first resistance layer. The second resistance layer may be provided on the first insulating layer. A part of the first resistance layer and a part of the second resistance layer may overlap with each other when viewed in the plan view from above. A contact hole penetrating the first insulating layer and connecting the first resistance layer and the second resistance layer may be provided at a position at which the part of the first resistance layer and the part of the second resistance layer overlap. At least the part of the conduction path electrically connecting the first gate electrode and the drain electrode may be constituted of the first resistance layer, the second resistance layer, and the contact hole.

According to this configuration, since the current path is bent in the up-and-down direction, the current path can be made long. Due to this, the electric resistance in the current path can be increased, so the current that flows between the drain electrode and the first gate electrode during when the switching device is off can be reduced.

In a configuration disclosed herein as an example, the second resistance layer may comprise a portion overlapping with the first resistance layer at a position at which the contact hole is not provided when viewed in the plan view from above.

As above, by providing even more portions where the first resistance layer and the second resistance layer overlap with each other, the semiconductor layer under the resistance layer becomes more resistant to the influence of the external electric field.

In a configuration disclosed herein as an example, the switching device may further comprise a second insulating layer provided on the resistance layer and a wiring provided on the second insulating layer.

According to this configuration, even when the potential of the wiring fluctuates, the semiconductor layer under the resistance layer is resistant to an influence of an electric field generated by the potential fluctuation of the wiring. Thus, the electric field concentration can be suppressed from occurring in the semiconductor layer by the potential fluctuation of the wiring.

In a configuration disclosed herein as an example, an entirety of an upper surface of the electron supply layer provided between the first gate electrode and the drain electrode may overlap with the resistance layer when viewed in the plan view from above.

According to this configuration, the electric field in the semiconductor layer located between the first gate electrode and the drain electrode (that is, the semiconductor layer under the resistance layer) becomes more resistant to the influence of the external electric field. Due to this, the electric field concentration by the influence of the external electric field can be suppressed from occurring in the semiconductor layer.

In a configuration disclosed herein as an example, the conduction path electrically connecting the first gate electrode and the drain electrode may extend around the drain electrode in a spiral shape.

According to this configuration, the current path between the first gate electrode and the drain electrode can be made even longer, and the electric resistance between the first gate electrode and the drain electrode can be made higher. Due to this, the current that flows between the first gate electrode and the drain electrode while the switching device is turned off can be reduced.

In a configuration disclosed herein as an example, the switching device may further comprise a second gate electrode provided above the electron supply layer and provided between the first gate electrode and the drain electrode when viewed in the plan view from above. The second gate electrode may be connected to a conduction path electrically connecting the first gate electrode and the drain electrode.

Notably, the second gate electrode may configure a part of the conduction path electrically connecting the first gate electrode and the drain electrode.

In this configuration, the potential of the second gate electrode changes together with the potential of the first gate electrode, since the second gate electrode is electrically connected to the first gate electrode. By controlling the potential of the first gate electrode to its off potential, the potential of the second gate electrode can be controlled to be at its off potential. By controlling the two gate electrodes (the first and second gate electrodes) to their off potentials, the 2DEG or 2DHG in the heterojunction can be depleted at plural positions. Due to this, the voltage resistance of the switching device while it is off can further be increased.

In a configuration disclosed herein as an example, the switching device may further comprise a first p-type layer provided between the first gate electrode and the electron supply layer and being in contact with the electron supply layer, and a second p-type layer provided between the second gate electrode and the electron supply layer and being in contact with the electron supply layer.

According to this configuration, even in a state where the potentials of the respective gate electrodes are the same potential as the source electrode, the switching device can be turned off by the depletion layer extending from the respective p-type layers to the heterojunction. That is, the switching device can be configured to be normally off.

In a configuration disclosed herein as an example, a thickness of the electron supply layer between the second p-type layer and the electron transport layer may be thicker than a thickness of the electron supply layer between the first p-type layer and the electron transport layer.

As described above, when the potential of the first gate electrode is changed, the potential of the second gate electrode changes accompanying therewith. However, an amount of change in the potential of the second gate electrode becomes smaller than an amount of change in the potential of the first gate electrode. Due to this, when the switching device turns on, a width by which the depletion layer under the second gate electrode (the second p-type layer) recedes toward the second p-type layer tends to become smaller than a width by which the depletion layer under the first gate electrode (the first p-type layer) recedes toward the first p-type layer. However, by adjusting the thickness of the electron supply layer as above, the second p-type layer can be arranged farther away from the heterojunction than the first p-type layer. Due to this, the depletion layer under the second gate electrode becomes capable of easily receding from the heterojunction upon when the switching device turns off. Due to this, the switching device can more surely be turned on.

In a configuration disclosed herein as an example, a p-type impurity concentration in the second p-type layer may be lower than a p-type impurity concentration in the first p-type layer.

According to this configuration, even if the amount of change in the potential of the second gate electrode is small upon when the switching device turns on, the depletion layer under the second gate electrode becomes capable of easily receding from the heterojunction. Due to this, the switching device can more surely be turned on.

In a configuration disclosed herein as an example, the electron supply layer may be constituted of AlGaN, and an Al/Ga ratio in the electron supply layer under the second gate electrode may be higher than an Al/Ga ratio in the electron supply layer under the first gate electrode.

Notably, the Al/Ga ratio is a ratio of Al relative to Ga. The Al/Ga ratio is equivalent to a value obtained by dividing an Al concentration in AlGaN by a Ga concentration in the AlGaN.

According to this configuration, even if the amount of change in the potential of the second gate electrode upon when the switching device turns on is small, the depletion layer under the second gate electrode can recede more easily from the heterojunction. Due to this, the switching device can more surely be turned on.

In a configuration disclosed herein as an example, the switching device may further comprise a third p-type layer provided on the electron supply layer, a third insulating layer provided on an upper surface of the electron supply layer located between the third p-type layer and the drain electrode, a conductive layer provided on the third insulating layer. The first gate electrode may he constituted of a conductor provided on the third p-type layer. The first gate electrode and the drain electrode may be electrically connected to each other via the conductive layer.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed.

Further, the art described in the description and the drawings may concurrently achieve a plurality of aims, and technical significance thereof resides in achieving any one of such aims.

What is claimed is:

1. A switching device comprising:
   an electron transport layer;
   an electron supply layer that is provided on the electron transport layer and in contact with the electron transport layer by heterojunction;
   a source electrode that is in contact with the electron supply layer;
   a drain electrode that is in contact with the electron supply layer at a position spaced from the source electrode; and
   a first gate electrode provided above the electron supply layer, provided between the source electrode and the drain electrode when viewed in a plan view from above, and electrically connected above the electron supply layer to the drain electrode,
   wherein an on-resistance of the switching device is lower than an electric resistance between the first gate electrode and the drain electrode.

2. The switching device of claim 1, further comprising a resistance layer provided above the electron supply layer, provided between the first gate electrode and the drain electrode when viewed in the plan view from above, and having resistivity higher than resistivity of the first gate electrode and the drain electrode,
   wherein at least a part of a conduction path electrically connecting the first gate electrode and the drain electrode is constituted of the resistance layer.

3. The switching device of claim 2, further comprising an insulating layer, wherein
   the resistance layer comprises a first resistance layer and a second resistance layer,
   the insulating layer covers the first resistance layer,
   the second resistance layer is provided on the insulating layer,
   a part of the first resistance layer and a part of the second resistance layer overlap with each other when viewed in the plan view from above,
   a contact hole penetrating the insulating layer and connecting the first resistance layer and the second resistance layer is provided at a position at which the part of the first resistance layer and the part of the second resistance layer overlap, and
   at least the part of the conduction path electrically connecting the first gate electrode and the drain electrode is constituted of the first resistance layer, the second resistance layer, and the contact hole.

4. The switching device of claim 3, wherein the second resistance layer comprises a portion overlapping with the first resistance layer at a position at which the contact hole is not provided when viewed in the plan view from above.

5. The switching device of claim 2, further comprising:
   an insulating layer provided on the resistance layer; and
   a wiring provided on the insulating layer.

6. The switching device of claim 2, wherein an entirety of an upper surface of the electron supply layer provided between the first gate electrode and the drain electrode overlaps with the resistance layer when viewed in the plan view from above.

7. The switching device of claim 1, wherein a conduction path electrically connecting the first gate electrode and the drain electrode extends around the drain electrode in a spiral shape.

8. The switching device of claim 1, further comprising a second gate electrode provided above the electron supply layer and provided between the first gate electrode and the drain electrode when viewed in the plan view from above,
   wherein the second gate electrode is connected to a conduction path electrically connecting the first gate electrode and the drain electrode.

9. The switching device of claim 8, further comprising:
   a first p-type layer that is provided between the first gate electrode and the electron supply layer and in contact with the electron supply layer; and
   a second p-type layer that is provided between the second gate electrode and the electron supply layer and in contact with the electron supply layer.

10. The switching device of claim 9, wherein a thickness of the electron supply layer between the second p-type layer and the electron transport layer is thicker than a thickness of the electron supply layer between the first p-type layer and the electron transport layer.

11. The switching device of claim 9, wherein a p-type impurity concentration in the second p-type layer is lower than a p-type impurity concentration in the first p-type layer.

12. The switching device of claim 8, wherein
    the electron supply layer is constituted of AlGaN, and
    an Al/Ga ratio in the electron supply layer under the second gate electrode is higher than an Al/Ga ratio in the electron supply layer under the first gate electrode.

13. The switching device of claim 1, further comprising:
    a p-type layer provided on the electron supply layer;
    an insulating layer provided on an upper surface of the electron supply layer located between the p-type layer and the drain electrode; and
    a conductive layer provided on the insulating layer,
    wherein the first gate electrode is constituted of a conductor provided on the p-type layer, and
    the first gate electrode and the drain electrode are electrically connected to each other via the conductive layer.

* * * * *